(12) United States Patent
Kubacki

(10) Patent No.: US 7,488,507 B2
(45) Date of Patent: *Feb. 10, 2009

(54) CAPACITOR WITH PLASMA DEPOSITED DIELECTRIC

(76) Inventor: Ronald M. Kubacki, 3514 Rollingside Dr., San Jose, CA (US) 95148

( * ) Notice: Subject to any disclaimer, the term of this patent is extended or adjusted under 35 U.S.C. 154(b) by 1011 days.

This patent is subject to a terminal disclaimer.

(21) Appl. No.: 10/862,964

(22) Filed: Jun. 8, 2004

(65) Prior Publication Data

US 2004/0234903 A1 Nov. 25, 2004

Related U.S. Application Data

(60) Division of application No. 10/054,259, filed on Jan. 22, 2002, now Pat. No. 6,794,098, which is a continuation-in-part of application No. 09/435,396, filed on Nov. 6, 1999, now Pat. No. 6,416,938, which is a continuation-in-part of application No. 08/873,513, filed on Jun. 12, 1997, now abandoned.

(60) Provisional application No. 60/020,392, filed on Jun. 25, 1996.

(51) Int. Cl.
  *B05D 5/12* (2006.01)

(52) U.S. Cl. ........................................ 427/79; 430/323
(58) Field of Classification Search ................... 427/79, 427/80, 81; 430/323
See application file for complete search history.

(56) References Cited

U.S. PATENT DOCUMENTS 6,416,938 B1 * 7/2002 Kubacki ...................... 430/323

* cited by examiner

*Primary Examiner*—Roberts Culbert

(57) ABSTRACT

A capacitor is formed utilizing a plasma deposited capacitor dielectric wherein the plasma deposition is a two-component reaction comprising a silicon donor, which is non-carbon containing and non-oxygenated, and an organic precursor, which is non-silicon containing and non-oxygenated. The plasma deposition produces a capacitor dielectric that can exhibit a low dielectric constant and, in selected depositions, a response to photo-oxidation induced by exposure to radiated electromagnetic energy in the presence of oxygen. Photo-oxidation of selected depositions can be used to alter the dielectric constant of the capacitor dielectric after the capacitor has been fabricated. The capacitor may be used in precision filter applications.

20 Claims, 5 Drawing Sheets

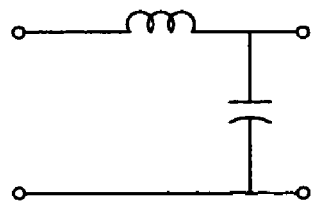
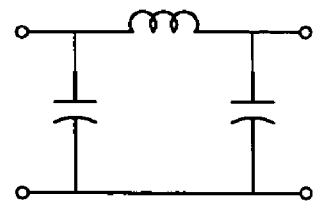
FIG. 6(a)         FIG. 6(b)
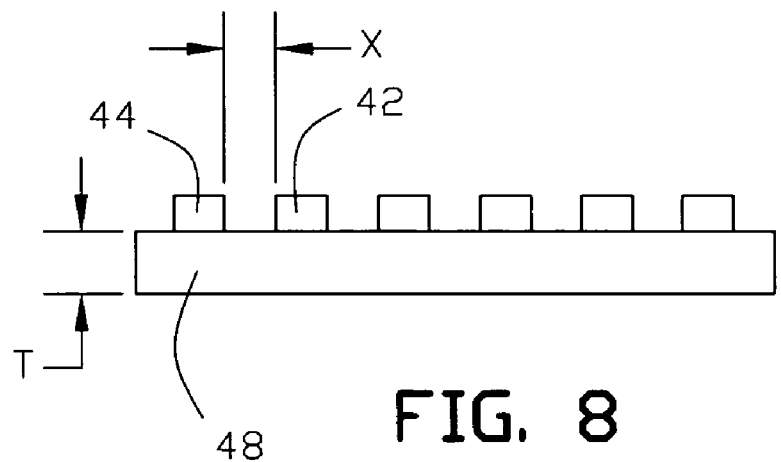
FIG. 8
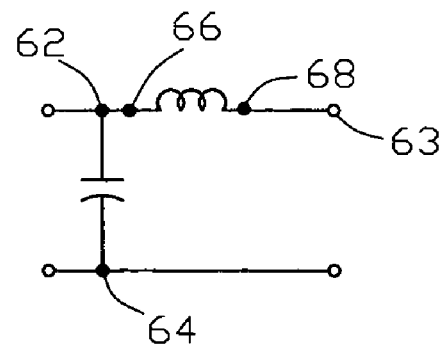
FIG. 10

CAPACITOR WITH PLASMA DEPOSITED DIELECTRIC

CROSS REFERENCE TO RELATED APPLICATIONS

This application is a division of U.S. application Ser. No. 10/054,259, filed Jan. 22, 2002, now U.S. Pat. No. 6,794,098, which is a continuation-in-part of U.S. application Ser. No. 09/435,396, filed Nov. 6, 1999, now U.S. Pat. No. 6,416,938, which is a continuation-in-part of U.S. application Ser. No. 08/873,513, filed Jun. 12, 1997, now abandoned, which claims the benefit of U.S. Provisional Application No. 60/020,392, filed Jun. 25, 1996, each of which is incorporated herein by reference in its entirety.

FIELD OF THE INVENTION

The present invention relates to the formation of dielectrics and more particularly to capacitors with dielectrics formed by plasma-initiated polymerization utilizing direct application of electrical energy.

BACKGROUND OF THE INVENTION

One type of solid state capacitors, known as Metal-Insulator-Metal (MIM) capacitors, are basically formed from a dielectric disposed between two electrical conductors or electrodes, which can be layered as part of a semiconductor microchip. The area of each conductor, and the thickness and dielectric constant (k) of the dielectric, primarily establish the capacitance of the resulting capacitor. The process of forming the dielectric controls both the thickness and the dielectric constant for the dielectric. Generally once a dielectric is formed, its dielectric constant and the capacitance of the formed capacitor are fixed. Consequently, inefficient techniques for trimming capacitance after fabrication of the capacitor are employed. For example, multiple interconnected capacitors can be incorporated into a solid state structure and selectively cut out of the active circuit to trim the overall value of capacitance. This process, at best, provides a stepped value of capacitance trimming.

Known dielectrics for MIM capacitors are spun-on glasses, tetraethoxysilane (TEOS)/ozone films deposited at atmospheric or sub-atmospheric pressures, plasma deposited films either from silane ($SiH_4$)/oxygen or TEOS reactions, or more recently, $SiO_2$ films deposited by high density plasma chemical vapor deposition. The fixed dielectric constant of these deposited materials can range anywhere from 3.9 to approximately 5.0, largely depending on their density and how much moisture they absorb. Typical ranges for dielectric constants are: between 3.9 and 4.1 for plasma deposited silane oxides; between 4.1 and 4.3 for TEOS generated oxides; and 4.5 or higher for TEOS/ozone films.

It is known that introduction of fluorine in the above processes can produce dielectrics with a lower k value. This approach results in a fluorinated oxide, sometimes called fluorosilicate glass or, more accurately, a silicon oxyfluoride. Although there is a distinct tradeoff between the amount of fluorine added and the stability of the dielectric, the process can produce stable dielectrics with a k value around 3.5.

Most dielectrics with a k value less than 3.0 (low k dielectrics) fall into one of the following basic categories: fluorinated polyimides; non-polyimide C—H polymers; fluoropolymers and siloxane polymers. Fabrication processing temperatures place additional limitations on low k dielectric selections from these categories at higher processing temperatures.

With respect to organosilicons that might serve as dielectrics, despite intensive research on the plasma deposition of amorphous silicon from monosilane ($SiH_4$), there have been only a few reports exploring the formation of Si—Si bonded polymers from monosubstituted organosilanes. Haller reported an example of selective dehydrogenative polymerization, but no photochemical studies were described. See Haller, *Journal of the Electrochemical Society A*, Vol. 129, 1987, p. 180, and Inagaki and Hirao, *Journal of Polymer Science A*, Vol. 24, 1986, p. 595. Studies on the plasma chemistry of methylsilane ($MeSiH_3$) have involved higher radiofrequency powers and temperatures which promote formation of amorphous silicon carbide (SiC) rather than reactive polymeric product. See Delpancke, Powers, Vandertop and Somorjai, *Thin Solid Films*, Vol. 202, 1991, p. 289. Low power plasma polymerization of tetramethylsilane and related precursors has been proposed to result in the formation of Si—C—Si linkages. See Wrobel and Wertheimer, *Plasma Deposition, Treatment and Etching of Polymers*, Academic Press, New York, Chapter 3. Such materials lack sufficient absorption in light above approximately 225 nm wavelength, but have been studied as far ultraviolet (193 nm wavelength) resists by Horn and associates. See Horn, Pang and Rothschild, *Journal of Vacuum Science Technology B*, Vol. 8, 1991, p. 1493. Polymer chemistry teaches the use of the basic silanes are insignificant as a monomer for polymerization type of polymer. Furthermore, polysiloxanes are differentiated from the basic silanes, and contrasted as being very important in terms of monomers for polymerization. See Stevens, Malcom P., *Polymer Chemistry, An Introduction*, Addison-Wesley Publishing Co., 1975: p. 334.

Work has been reported on the synthesis of soluble polyalkylsilyne network polymers ($[SiR]_n$) which exhibit intense ultraviolet absorption (associated with extended Si—Si bonding) and may be photo-oxidatively patterned to give stable siloxane networks. See Bianconi and Weidman, *Journal of the American Chemical Society*, Vol. 110, 1988, p. 2341. Dry development is accomplished by selective anisotropic removal of unexposed material by chlorine or hydrobromic acid reactive ion etching. See Hornak, Weidman and Kwock, *Journal of Applied Physics*, Vol. 67, 1990, p. 2235, and Horn, Pang and Rothschild, *Journal of Vacuum Science Technology B*, Vol. 8, 1991, p. 1493. The exposed, oxidized material may be removed by either wet or dry fluorine based chemistry. Kunz and associates have shown that this makes polysilynes particularly effective as 193 nm wavelength photoresists. See Kunz, Bianconi, Horn, Paladugu, Shaver, Smith, and Freed, *Proceedings of the Society of Photo-optical and Instrumentation Engineers*, Vol. 218, 1991, p. 1466. The high absorbability and the wavelength limits photo-oxidation to the surface, eliminating reflection, and the pattern is transferred through the remainder of the film during the reactive ion etch (RIE) development. Studies of organosilicon hydride network materials containing reactive R—Si—H moieties have found that such high silicon compositions as $[MeSiH_{0.5}]_n$ exhibit superior photosensitivity and function as single layer photodefinable glass etch masks. See Weidman and Joshi, *New Photodefinable Glass Etch Masks for Entirely Dry Photolithography: Plasma Deposited Organosilicon Hydride Polymers, Applied Physics Letters*, Vol. 62, No. 4, 1993, p. 372. However, cost and availability of the exotic organosilicon feedstocks have significantly inhibited the transfer of such photosensitive organosilicon hydride network materials into microcircuit fabrication. Further, films deposited from single component organosilicon feedstocks possess limited latitude in alteration of deposited film characteristics, such as the radiation frequency of photosensitivity and selectivity during etch processes.

An object of the present invention is a capacitor with a plasma deposited dielectric that has a low dielectric constant and good thermal stability at higher processing temperatures. Another object of the present invention is a capacitor with a plasma deposited dielectric that has a dielectric constant, and therefore, a value of capacitance, that can be changed after deposition of the dielectric or fabrication of the capacitor. Such capacitors are of particular advantage in the formation of electrical filters, among other applications, that require on-chip formation of precision value capacitors.

BRIEF SUMMARY OF THE INVENTION

One aspect of the present invention is a capacitor dielectric that is formed from a two-component plasma reaction in a substantially air-evacuated plasma chamber. The first component of the two-component plasma reaction comprises a non-carbon containing and non-oxygenated silicon donor, and the second component comprises a non-silicon containing and non-oxygenated organic precursor.

Another aspect of the present invention is a capacitor that has a dielectric formed from a two-component plasma reaction in a substantially air-evacuated plasma chamber. The first component of the two-component plasma reaction comprises a non-carbon containing and non-oxygenated silicon donor, and the second component comprises a non-silicon containing and non-oxygenated organic precursor. The formed dielectric has a dielectric constant that can be altered subsequent to the plasma reaction by photo-oxidation of the dielectric by exposure to suitable electromagnetic energy in the presence of oxygen. This post deposition altering of the dielectric constant can be used to adjust the capacitance of the capacitor after fabrication, including while the capacitor is used in an active circuit.

Another aspect of the present invention is an electrical filter utilizing one or more capacitors, with one or more of the capacitors having a dielectric formed from a two-component plasma reaction in a substantially air-evacuated plasma chamber. The first component of the two-component plasma reaction comprises a non-carbon containing and non-oxygenated silicon donor, and the second component comprises a non-silicon containing and non-oxygenated organic precursor. The formed dielectric has a dielectric constant that can be altered subsequent to the plasma reaction by photo-oxidation of the dielectric by exposure to suitable electromagnetic energy in the presence of oxygen. This post deposition altering of the dielectric constant can be used to tune the impedance of the electrical filter subsequent to fabrication, including while the filter is used in an active circuit. These and other aspects of the invention are set forth in the specification and appended claims.

BRIEF DESCRIPTION OF THE DRAWINGS

For the purpose of illustrating the invention, there is shown in the drawings a form that is presently preferred; it being understood, however, that this invention is not limited to the precise arrangements and instrumentalities shown.

FIG. 6($a$) diagrammatically illustrates a second order Butterworth LC filter that was formed using a capacitor with a plasma deposited dielectric of the present invention.

FIG. 6($b$) diagrammatically illustrates a third order Butterworth Pi filter that was formed using capacitors with a plasma deposited dielectric of the present invention.

FIG. 8 illustrates a typical cross section of a planar interdigitated capacitor.

FIG. 10 diagrammatically illustrates a second order Butterworth LC filter that was formed using an interdigitated capacitor with a plasma deposited dielectric of the present invention.

DETAILED DESCRIPTION OF THE INVENTION

Figure 1:
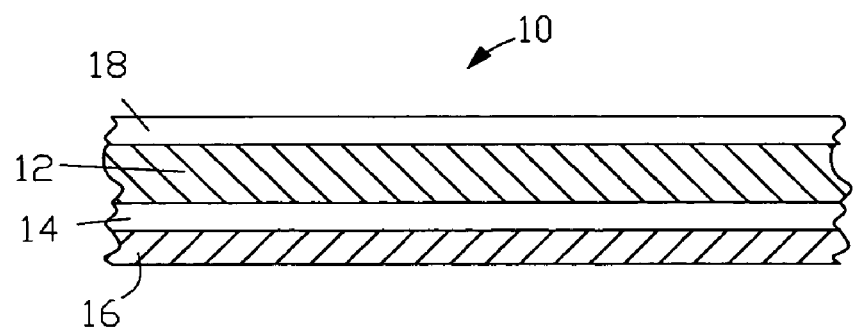
FIG. 1 is a diagrammatic cross sectional view of one example of a capacitor of the present invention.

Illustrated in FIG. 1 is a typical cross section of one example of a capacitor 10 of the present invention with plasma deposited capacitor dielectric 12. A first (bottom) electrode 14 is formed on substrate 16 by a suitable process, such as sputter deposition of a conducting material through an aperture in a shadow mask, to form a first electrode in the shape of the aperture. In this non-limiting example of the invention, substrate 16 is a semiconductor silicon grade wafer formed from 1,0,0 crystal orientation silicon and the first electrode 14 is sputtered 99.99% pure aluminum having a thickness of approximately 0.5 micrometers. The substrate in this example provides a suitable deposition layer for the first electrode and may be any suitable base material. In some of the following examples, the silicon substrate itself is used as the first electrode of capacitor 10. Substrate 16, with first electrode 14 deposited on the substrate, is fixed in a plasma deposition chamber. After air is evacuated from the chamber, a two-component plasma reaction, wherein the first component comprises a non-carbon containing and non-oxygenated silicon donor, and the second component comprises a non-silicon containing and non-oxygenated organic precursor, deposits capacitor dielectric 12 on first conductor 14 as further described below. Suitable (but non-limiting) thicknesses of the deposited capacitor dielectric range from 0.1 micrometer to 2.0 micrometers. A second (top) electrode 18 is formed over capacitor dielectric 12 by any suitable method, such as the previously mentioned sputter deposition or photolithographic patterning on blanket sputtered aluminum to a thickness of approximately 0.5 micrometers. The amount of coverage of the capacitor dielectric 12 over first electrode 14, and coverage of the second electrode 18 over dielectric 12 can vary depending upon the desired capacitor characteristics for a particular application.

When the plasma deposited capacitor dielectric 12 forms a photo-oxidizable material, as further described below, the dielectric may be exposed to suitable radiated electromagnetic energy in the presence of oxygen to change the dielectric constant of the dielectric, and, therefore, capacitance, of the capacitor 10. For these examples of the invention, the capacitance of formed capacitor 10 can be trimmed after plasma deposition of the capacitor dielectric. Depending upon the particular fabrication method for the capacitor 10, the photo-oxidation may be accomplished before forming second electrode 18, or after complete fabrication of the capacitor. For example, for a MIM formed capacitor 10, substrate 16 may comprise an ultraviolet (UV) light-transparent material such as quartz, and first electrode 14 may also comprise a UV light-transparent material such as indium tin oxide (ITO). The photo-oxidizable dielectric may be radiated with UV light through the UV transparent substrate and first electrode to alter the dielectric constant of the dielectric and to trim the capacitance of the capacitor after fabrication. The photosensitive dielectric permits sufficient oxygen mobility to support photo-oxidation of the fabricated capacitor. Further this method allows dynamic trimming of the capacitor while it is operating in an active circuit.

Alternatively, one or more holes or windows can be opened in the electrode of a fabricated capacitor's electrode to expose capacitor dielectric 12 to radiated UV energy, which will couple and radiate into the dielectric material. For interdigitated capacitors, which are further discussed below, the capacitor dielectric can be directly photo-oxidized after fabrication of the capacitor, since the capacitor electrodes do not cover the capacitor dielectric. The following examples further illustrate other embodiments of the present invention.

EXAMPLES A

To form a capacitor with a plasma deposited capacitor dielectric of the present invention, the two component reactants, namely a silicon donor and an organic precursor are flowed into an evacuated plasma chamber, wherein the two components react and deposit a capacitor dielectric on a first electrode in the chamber. First electrode may be formed on a suitable substrate. For this particular embodiment of the invention wherein a substrate is used, the term "substrated electrode" is used to define the structure of a first electrode formed on the substrate. Any plasma chamber with the following characteristics would be suitable for the application:

(1) hardware for evacuating the chamber to eliminate the presence of oxygen;

(2) electrodes supplied with electrical energy to sustain the plasma;

(3) hardware for flowing the silicon donor and the organic precursor through the plasma chamber at controlled flow pressures; and (4) hardware for holding the substrated electrode in position in the plasma chamber.

For this particular example deposition, a Model DSN Room Temperature Plasma Deposition System, which is available from Ionic Systems (San Jose, Calif.), was used. This plasma chamber is substantially as disclosed in U.S. Pat. No. 4,262,631, which is incorporated herein by reference. The plasma chamber was equipped with dual power supplies of 2,500 W and 1,000 W that operated at 13.56 MHz. The plasma chamber was vacuum pumped with an Edwards High Vacuum International (Wilmington, Mass.) Model E2M-80 direct drive rotary vane pump. Flow pressures were monitored with an M K S Instruments, Inc. (Andover, Mass.) Series 220 BARATRON.

With use of the Model DSN Room Temperature Plasma Deposition System, the substrated electrode can be fixtured in the positive column of the plasma discharge. This reduces the bombardment by energetic species, as there is no net charge density in the positive column which reduces crosslinking in the deposited capacitor dielectric to enhance a low dielectric constant.

The materials used as silicon donor and organic precursor must be in a gaseous or vapor state to achieve flow through the plasma chamber. Selection of materials for the silicon donor and organic precursor will be dependent upon the desired characteristics of the capacitor dielectric, the cost of the materials, and how well-behaved the materials are in the processing environment.

The material used as a silicon donor is a substantially non-carbon containing and non-oxygenated silicon compound. Silicon hydrides, that is, silanes ($Si_nH_{2n+2}$) are preferred. In the preferred embodiments of the invention, monosilane ($SiH_4$) is used as the silicon donor. Other suitable source materials for silicon donors include disilane ($Si_2H_6$) and dichlorosilane ($SiH_2Cl_2$).

The material used as an organic precursor is a substantially non-silicon containing and non-oxygenated organic compound. In the preferred embodiments, ethylene ($C_2H_4$), methane ($CH_4$) and ethane ($C_2H_6$) are used as gaseous organic precursors, and toluene ($C_6H_5CH_3$) is used as a liquid vapor donor. Ethylene and methane are of particular use in producing a capacitor dielectric with a low dielectric constant. Other suitable sources for organic precursors broadly include organic compounds such as alkanes, alkenes, alkynes, phenyls and aromatic hydrocarbons. Selective organic compounds may be blended to achieve an optimum organic precursor.

In selected embodiments, monosilane is used as the silicon donor, and ethylene gas or toluene vapor is used as the organic precursor to deposit the capacitor dielectric on the substrated electrode. Flow rates of monosilane have been used in the range of 20 to 200 scc/min (preferably 25 to 35 scc/min), and organic precursors flowed at 100 to 300 scc/min (preferably 140 to 180 scc/min). Pressure in the plasma chamber has been allowed to build to 150 to 500 mtorr (preferably in the range of 180 to 300 mtorr). Power for deposition of the dielectric has been applied in densities from 0.8 to 15 mW/cc, with the optimum range being 8 to 10 mW/cc at 13.56 MHz. These operating parameters will be understood by those skilled in the art as typical operating conditions, and not limiting the scope of the invention.

The monosilane used was Semiconductor Grade Silane ($SiH_4$), which is available from Liquid Carbonic Industries Corp. (Oak Brook, Ill.). Organic precursors were 99.9% pure ethylene, supplied by Liquid Carbonic Industries Corp., or ACS Certified Class 1B toluene, supplied by Fisher Chemicals (Fair Lawn, N.J.).

Selected organic precursor materials must have sufficient vapor pressure, with or without heating, to allow their introduction into the plasma chamber. This includes a variety of materials that can be either a gas or liquid at standard temperature and pressure (STP). In most cases, the exposure of a liquid organic precursor in a containment vessel to the vacuum system will generate sufficient vapor flow to allow many liquids, as well as gases, to be used with no operator exposure. If sufficient vapor pressure is not attained, the liquid donor may be heated slightly to increase its vapor pressure. For the processing of the capacitor dielectric in the preferred embodiments of the invention, one gas at STP, ethylene, or one liquid at STP, toluene, is used as the organic precursor. Toluene was selected due to its favorable vapor pressure, as well as its ultraviolet transmission characteristics. Neither the silicon donor nor the organic precursor can contain an appreciable amount of oxygen, since oxygen with ultraviolet exposure from the plasma during the deposition process would cause photo-oxidation of the silicon and degrade the photosensitivity of the deposited capacitor dielectric.

A silicon donor that is substantially non-carbon and non-oxygen containing inhibits the polymerization of the silicon donor with the organic precursor during the plasma reaction. This promotes the encasing of plasma generated modified forms of the silicon donor that include (Si—H) and (Si—Si) low molecular weight fragments that is forming a self assembled composite film with nanometer scale silicon-silicon and silicon-hydrogen particles or dots within an organic polymer matrix formed substantially from plasma polymerization of the organic precursor. Therefore, photo-oxidation, if subsequently performed to alter the dielectric constant of the capacitor dielectric, is achieved primarily by the oxidation of the silicon within the interstitially situated modified forms of the silicon donor when the capacitor dielectric is subjected to radiated electromagnetic energy, such as UV light, in the presence of oxygen.

For the monosilane/ethylene depositions, ethylene was supplied to an inlet port on the plasma chamber and controlled with a manual flow valve. A vessel was used for the containment of liquid toluene for the monosilane/toluene depositions. The liquid nature of toluene at STP required the development of a method for the introduction of toluene vapors to the plasma chamber. A sample cylinder was obtained and thoroughly cleaned for the toluene introduction. After cleaning and drying, the cylinder was attached to the deposition system and evacuated to less that 10 mtorr. At this point, the valve on the sample cylinder was closed and the cylinder removed from the system. A clean stainless steel tube was attached to the sample cylinder. The tube was submerged in a vessel of reagent grade toluene and the shut-off valve was opened. The vacuum inside the sample cylinder was used to draw the toluene into the sample cylinder while introducing as little trapped gas as possible. After installation on the vacuum system, the shut-off valve was opened and the toluene was allowed to degas for fifteen minutes before any plasma processing was attempted. Seasoning runs were performed for one hour before actual depositions were performed for the capacitor dielectrics.

A water bath was installed on the liquid toluene vapor source to assist in keeping a constant vapor pressure during the depositions. No heating was used in the bath, but the temperature held at 23° C.±1° C. during depositions. Pressure during depositions held constant within ±5 mtorr. The effect of the evaporative cooling was minimal on the vapor pressure and flow of the liquid toluene donor. Flow from the vessel was controlled with a manually adjusted valve on the top of the containment vessel. Initially, no attempt was made to either heat or hold the liquid vessel isothermal to reduce evaporative cooling, which would have an impact on the ability to maintain constant flow. However, pressure during deposition was constantly monitored to determine if the flow of the toluene was dropping.

Initial depositions of the capacitor dielectric were performed with the plasma chamber's depositor under manual control to easily vary and control deposition conditions. A monosilane flow rate of 50 scc/min was used to establish a plasma chamber pressure with the monosilane, and then varying amounts of organic precursors were flowed to achieve the desired pressure increases. The ratio of the pressure of the organic precursor to the pressure of the monosilane was used for monitoring during the screening. Weight ratios of organic precursor to monosilane of less than 1:4 and greater than 2.5:1 resulted in capacitor dielectrics of negligible photosensitivity. These non-photosensitive dielectrics are generally suitable for forming low k capacitors that can not be trimmed by photo-oxidation. For capacitor dielectrics with photosensitivity, weight ratios of organic precursor to monosilane of 1:2 and 1:1 were chosen. In addition, for deposition, input power to the plasma chamber was varied between 200 W and 400 W.

It is preferable to separately flow the silicon donor and organic precursor into the plasma chamber to enhance substantial uniformity of the plasma modified silicon donors within the resulting organic polymer matrix and prevent possible spontaneous pre-reactions. As understood by those skilled in the art, silicon donors and organic precursors can be premixed in a variety of ratios to ensure uniform component distribution, and reduce the cost and complexity of the piping and associated hardware for gas introduction into the plasma chamber. Donors and precursors can also be premixed or mixed in a manifold. Premixing of the silicon donor and organic precursor is acceptable but may require stricter process control to achieve a substantially uniform distribution within the film. Hydrogen or an inert gas may be added to increase uniformity due to its higher mobility.

As understood by those skilled in the art, a variety of deposition systems may be used that operate at a wide variety of power levels and types, including radio frequency range (approximately 40 kHz) through microwave, and electron cyclotron resonance systems operating in excess of 2 GHz. In the preferred embodiments, there is no substrated electrode heating involved, but the substrated electrode can be heated or cooled during the deposition process to enhance the properties of the capacitor dielectric. A wide variety of pressures, from ultrahigh vacuum (less than $10^{-7}$ torr) up to and exceeding atmospheric pressure can be used. In the preferred plasma chamber, the substrated electrode floats electrically, but it can be grounded or powered.

Subsequent to the plasma deposition of the capacitor dielectric on the substrated electrode, a second electrode is formed on the capacitor dielectric by a suitable method as described above for the first electrode.

Capacitance measurements of the fabricated capacitors were made using a QuadTech, Inc. Model 1710 LCR Digibridge at a frequency of 1 kHz. The dielectric constant for each capacitor dielectric was calculated from the following equation:

$$C=(\kappa \in_o A)/d \qquad \text{equation (1)}$$

where: C=measured capacitance;

κ=dielectric constant;

$\in_o$=permittivity of free space ($8.854 \times 10^{-12}$ farad/meter);

A=area of the electrodes; and d=the distance between the electrodes, which is equal to the thickness of the plasma deposited capacitor dielectric.

Figure 2:
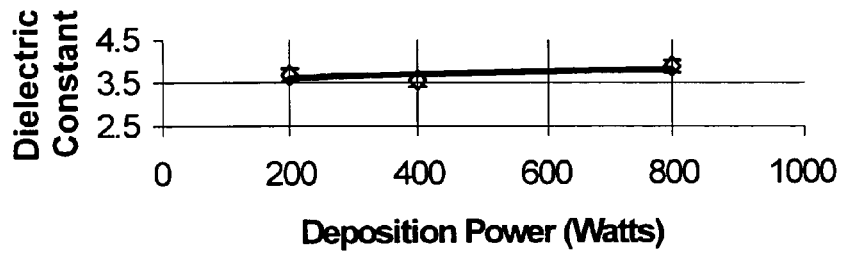
FIG. 2 is a graph illustrating variation of the dielectric constant for examples of the plasma deposited capacitor dielectric of the present invention when the input power to the deposition chamber is varied.
Figure 3:
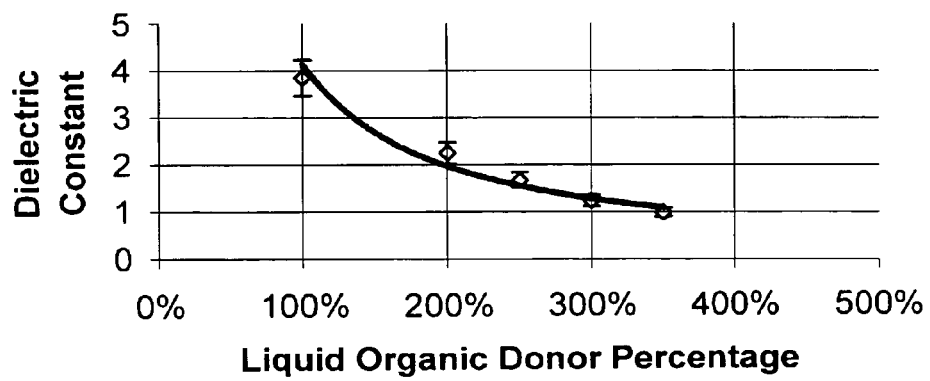
FIG. 3 is a graph illustrating variation of the dielectric constant for examples of the plasma deposited capacitor dielectric of the present invention when the percentage of one type of organic precursor used in the plasma reaction is varied.
Figure 4:
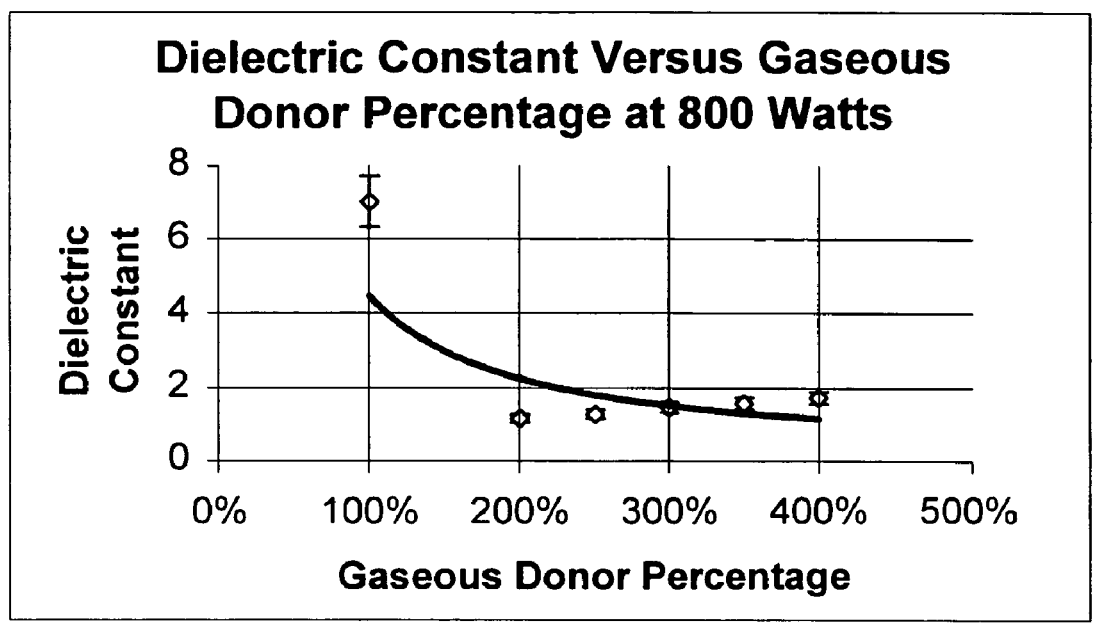
FIG. 4 is a graph illustrating variation of the dielectric constant for examples of the plasma deposited capacitor dielectric of the present invention when the percentage of another type of organic precursor used in the plasma reaction is varied.

FIG. 2 through FIG. 4 graphically illustrate the ability to form capacitors with plasma deposited dielectrics of the present invention that have a broad range of dielectric constants, ranging down to low k capacitors.

FIG. 2 graphically illustrates examples of the ability to vary the as-deposited dielectric constant of the capacitor dielectric of the present invention when the organic precursor is undiluted ACS Certified Class 1B toluene (liquid organic donor) and the input power (deposition power) to the plasma chamber is varied between 200 and 800 watts for the plasma deposition. The silicon donor, monosilane as specified above, is maintained at a 50 scc/min flow rate for all depositions and the toluene flow rate is such that the toluene pressure rise is the same as the silane pressure rise (100% liquid donor concentration). Initial chamber pressure for all depositions was less than 10 mtorr. The capacitor dielectric deposition process time, with input power at 200, 400 and 800 watts as indicated in FIG. 2, was 2,000 seconds. The calculated dielectric constants were: 3.677 for the 200-watt deposition; 3.563 for the 400-watt deposition, and 3.845 for the 800-watt deposition.

FIG. 3 graphically illustrates examples of the ability to vary the as-deposited dielectric constant of the capacitor dielectric of the present invention when the organic precursor is undiluted ACS Certified Class 1B toluene (liquid organic donor) and is varied in relative pressure to the silicon donor, monosilane (as specified above), from 100% to 350% for the plasma depositions, while the input power to the plasma chamber is held constant at 800 watts. The monosilane was maintained at a 50 scc/min flow rate for all depositions, and all depositions had a process time of 2,000 seconds. Initial chamber pressure for all depositions was less than 10 mtorr. For the deposition in which the relative pressure of toluene to that of the monosilane was 100%, the calculated as-deposited capacitor dielectric was 3.845; for the deposition in which the relative pressure of toluene to that of the monosilane was 200%, the calculated as-deposited capacitor dielectric was 2.354; for the deposition in which the relative pressure of toluene to that of the monosilane was 250%, the calculated as-deposited capacitor dielectric was 1.65; for the deposition in which the relative pressure of toluene to that of the monosilane was 300%, the calculated as-deposited capacitor dielectric was 1.216; and for the deposition in which the relative pressure of toluene to that of the monosilane was 350%, the calculated as-deposited capacitor dielectric was approximately equal to one.

FIG. 4 graphically illustrates examples of the ability to vary the as-deposited dielectric constant of capacitor dielectric of the present invention when the organic precursor is 99.9% pure ethylene (gaseous donor) and is varied in relative pressure to the silicon donor, monosilane (as specified above), from 100% to 400% for the plasma deposition, while the input power to the plasma chamber is held constant at 800 watts. The monosilane was maintained at a 50 scc/min flow rate for all depositions, and all depositions had a process time of 2,000 seconds. Initial chamber pressure for all depositions was less than 10 mtorr. For the deposition in which the relative pressure of ethylene to that of the monosilane was 100%, the calculated as-deposited capacitor dielectric was 6.939; for the deposition in which the relative pressure of ethylene to that of the monosilane was 200%, the calculated as-deposited capacitor dielectric was 1.082; for the deposition in which the relative pressure of ethylene to that of the monosilane was 250%, the calculated as-deposited capacitor dielectric was 1.111; for the deposition in which the relative pressure of ethylene to that of the monosilane was 300%, the calculated as-deposited capacitor dielectric was 1.388; for the deposition in which the relative pressure of ethylene to that of the monosilane was 350%, the calculated as-deposited capacitor dielectric was approximately equal to 1.455; and for the deposition in which the relative pressure of ethylene to that of the monosilane was 400%, the calculated as-deposited capacitor dielectric was approximately equal to 1.65.

In the above examples, the as-deposited dielectric constant of the plasma deposited dielectric used with a capacitor of the present invention is varied by altering process parameters of the two-component plasma deposition process for the dielectric. Photo-oxidation is not used to further alter the dielectric constant of the dielectric. As indicated above, some plasma process conditions will not produce a suitably photosensitive capacitor dielectric, but these dielectrics may be used in capacitors of the present invention that use as-deposited dielectrics.

EXAMPLES B

In these examples of the invention, the plasma deposited capacitor dielectric is exposed to suitable radiated electromagnetic energy in the presence of oxygen to alter the dielectric constant of the dielectric, and the capacitance, of the formed capacitor after the plasma deposition of the dielectric.

Capacitors with plasma deposited dielectrics of the present invention were prepared on substrates of silicon semiconductor wafers that were designated (Sample ID) as indicated in Table 1. In these examples, the substrate formed the first electrode of each capacitor. Other conducting materials may be used for the first electrode, such as aluminum, as described under Examples A above. For these plasma dispositions of the capacitor dielectrics, the silicon donor was monosilane and the organic precursor was either ethylene (gas precursor in Table 1) or toluene (liquid precursor in Table 1). The pressure of the organic precursor indicated in the table is relative to the pressure that established the monosilane flow rate indicated in the table. In other words, concentrations of the silicon donor and organic precursor for a particular deposition are related to partial pressures attributable to each component. For example, if the plasma chamber was started at 10 mtorr of pressure, and the monosilane flow stabilized and gave 110 mtorr of pressure, the flow rate (concentration) of monosilane was responsible for 100 mtorr of pressure. If 50 percent concentration of the organic precursor was achieved, then the organic precursor flow rate (concentration) added an additional 50 mtorr of pressure. Process parameters for the plasma deposition of the capacitor dielectric on each substrate are listed in Table 1.

TABLE 1

Data for Plasma Deposition of Capacitor Dielectric

| Sample ID | Flow Rate of Monosilane (scc/min) | Partial Pressure of the Organic Precursor Relative to Monosilane (%) | Input Power to Plasma Chamber (W) | Duration of Deposition (s) |
| --- | --- | --- | --- | --- |
| 1 | 50 | 50% (gas precursor) | 200 | 2,200 |
| 3 | 50 | 50% (liquid precursor) | 200 | 2,200 |
| A | 20 | 45% (gas precursor) | 100 | 2,200 |
| C | 60 | 45% (gas precursor) | 100 | 2,200 |

Quadrants (see FIG. 5 for quadrant designations I, II, III and IV) of each sample plasma deposited capacitor dielectric were photo-oxidized at different dosages (including no photo-oxidation—0 exposure time) by varying time exposure to a radiated electromagnetic energy (in this example, UV light source operating at 254 nm wavelength and with an energy density of 1 mj/s from UVP, Inc. Model UVG-54) in the presence of oxygen, as indicated in Table 2. Index of refraction was measured in each quadrant by optical ellipsometry, and is as indicated in Table 2.

TABLE 2

Data for Plasma Deposited Capacitor Dielectrics
with Various Exposures

| Sample ID | Exposure Time (min) | Sample Quadrant | Film Thickness (Å) | Index Of Refraction |
|---|---|---|---|---|
| 1 | 0 | IV | 1016 | 1.949 |
|  | 15 | I | 1013 | 1.959 |
|  | 30 | III | 1063 | 1.799 |
|  | 45 | II | 1107 | 1.730 |
| 3 | 0 | IV | 1009 | 1.669 |
|  | 15 | I | 1121 | 1.604 |
|  | 30 | III | 1139 | 1.594 |
|  | 45 | II | 1155 | 1.589 |
| A | 0 | IV | 713 | 1.787 |
|  | 15 | I | 729 | 1.747 |
|  | 30 | III | 749 | 1.718 |
|  | 45 | II | 770 | 1.680 |
| C | 0 | IV | 387 | 2.718 |
|  | 15 | I | 439 | 1.966 |
|  | 30 | III | 484 | 1.713 |
|  | 45 | II | 540 | 1.654 |

Figure 5:
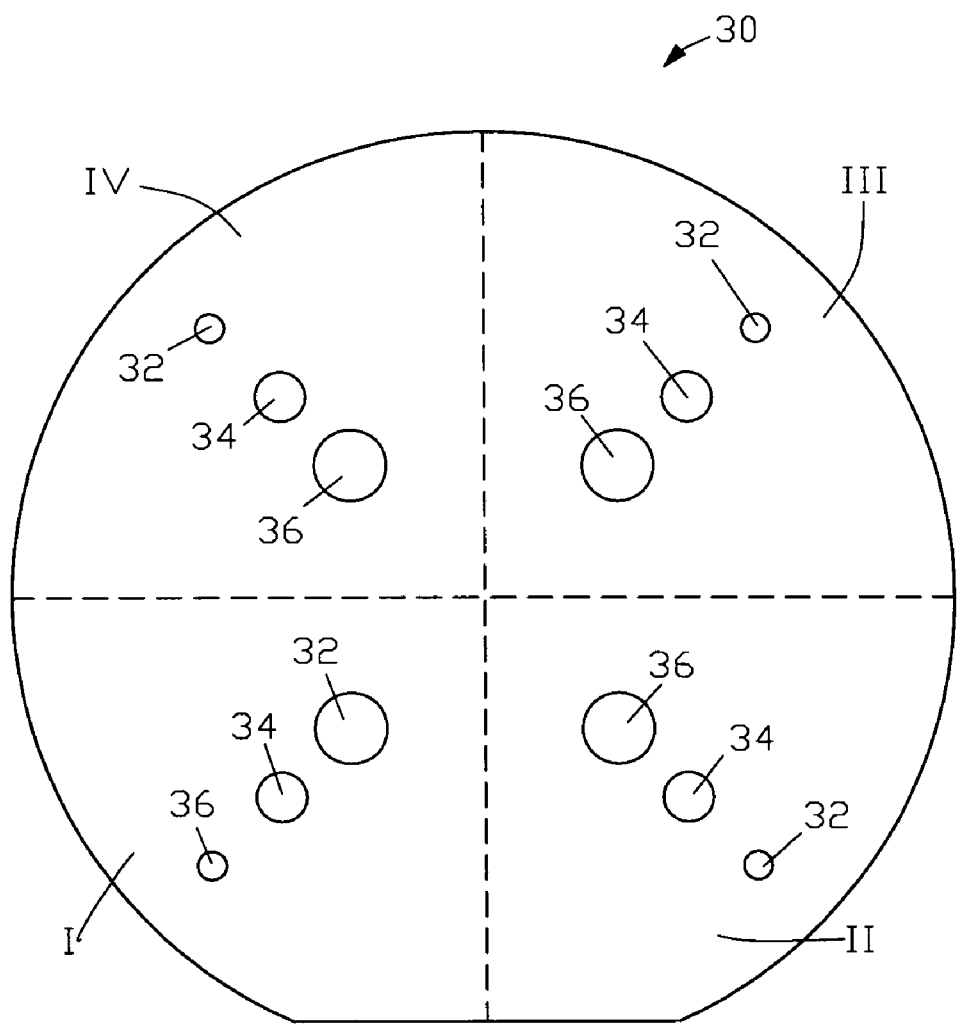
FIG. 5 is the layout of a mask used to create electrodes for examples of the capacitor of the present invention.

A shadow mask 30, the layout of which is illustrated in FIG. 5, was fabricated to form a pattern of second electrodes on the plasma deposited capacitor dielectric that was photo-oxidized to varying dosages on each sample. As illustrated in FIG. 5, a 1-mm diameter dot second electrode 32; a 2-mm diameter dot second electrode 34; and a 3-mm diameter dot second electrode 36 was formed in each of the four quadrants by sputter deposition of aluminum through mask 30. Consequently a group of three capacitors with plasma deposited dielectric were formed in each quadrant of a sample, with the silicon substrate as the first electrode and each of the three dot electrodes as the second electrode for a capacitor.

Table 3 illustrates the capacitance and value of dielectric constant for the 3-mm dot capacitors on Sample ID 1. Capacitance measurements of the capacitors were made using a QuadTech, Inc. Model 1710 LCR Digibridge at a frequency of 1 kHz. Dielectric constants were calculated using equation (1).

TABLE 3

Data for Capacitors formed with 3-mm Dot Electrodes
on Sample ID 1

| Sample Quadrant | Exposure Time (min) | Index of Refraction | Capacitance (nF) | Dielectric Constant |
|---|---|---|---|---|
| IV | 0 | 1.949 | 3.659 | 4.854 |
| I | 15 | 1.959 | 2.861 | 4.684 |
| III | 30 | 1.799 | 2.395 | 4.114 |
| II | 45 | 1.730 | 1.916 | 3.427 |

The results in Table 3 indicate that a dielectric constant varying from 3.427 to 4.854 was achieved by varying the time of exposure to the radiated electromagnetic energy (at constant energy density) for the plasma deposited capacitor dielectric on Sample ID 1. This is a 41.64 percent range in the change of the dielectric constant of the plasma deposited capacitor dielectric.

Table 4 illustrates the capacitance and value of dielectric constant for the 2-mm dot capacitors on Sample ID 3. Capacitance measurements and dielectric constant calculations were performed as indicated above.

TABLE 4

Data for Capacitors formed with 2-mm Dot Electrodes
on Sample ID 3

| Sample Quadrant | Exposure Time (min) | Index of Refraction | Capacitance (nF) | Dielectric Constant |
|---|---|---|---|---|
| IV | 0 | 1.669 | 2.371 | 8.106 |
| I | 15 | 1.604 | 1.864 | 7.081 |
| III | 30 | 1.594 | 1.545 | 5.962 |
| II | 45 | 1.589 | 1.203 | 4.707 |

The results in Table 4 indicate that a dielectric constant varying from 4.707 to 8.106 was achieved by varying the time of exposure to the radiated electromagnetic energy (energy density held constant) for the plasma deposited capacitor dielectric on Sample ID 3. This is a 72.21 percent range in the change of the dielectric constant of the plasma deposited capacitor dielectric.

Table 5 illustrates the capacitance and value of dielectric constant for the 2-mm dot capacitors on Sample ID A. Capacitance measurements and dielectric constant calculations were performed as indicated above.

TABLE 5

Data for Capacitors formed with 2-mm Dot Electrodes
on Sample ID A

| Sample Quadrant | Exposure Time (min) | Index of Refraction | Capacitance (nF) | Dielectric Constant |
|---|---|---|---|---|
| IV | 0 | 1.787 | 2.536 | 6.126 |
| I | 15 | 1.747 | 2.438 | 6.022 |
| III | 30 | 1.718 | 2.334 | 5.923 |
| II | 45 | 1.680 | 2.201 | 5.742 |

The results in Table 5 indicate that a dielectric constant varying from 5.742 to 6.126 was achieved by varying the time of exposure to the radiated electromagnetic energy (energy density held constant) for the plasma deposited capacitor dielectric on Sample ID A. This is a 6.68 percent range in the change of the dielectric constant of the plasma deposited capacitor dielectric.

Table 6 illustrates the capacitance and value of dielectric constants for the 3-mm dot capacitors on Sample ID C. Capacitance measurements and dielectric constant calculations were performed as indicated above.

TABLE 6

Data for Capacitors formed with 3-mm Dot Electrodes
on Sample ID C

| Sample Quadrant | Exposure Time (min) | Index of Refraction | Capacitance (nF) | Dielectric Constant |
|---|---|---|---|---|
| IV | 0 | 2.718 | 4.092 | 3.127 |
| I | 15 | 1.966 | 3.985 | 2.499 |
| III | 30 | 1.713 | 3.077 | 2.407 |
| II | 45 | 1.654 | 2.168 | 1.892 |

The results in Table 6 indicate that a dielectric constant varying from 1.892 to 3.127 was achieved by varying the time of exposure to the radiated electromagnetic energy (energy density held constant) for the plasma deposited capacitor dielectric on Sample ID C. This is a 65.27 percent range in the change of dielectric constant of the plasma deposited capacitor dielectric.

The results in Table 3 through Table 6 illustrate that the capacitor dielectric of the present invention can be used to fabricate capacitors wherein the value of the dielectric constant of the dielectric, and capacitance of the capacitor, can be altered by controlled photo-oxidation of the dielectric after the dielectric has been plasma deposited on the first electrode. As further explained below, the photo-oxidation may be accomplished after fabrication of the complete capacitor to provide a precisely trimmable capacitor.

As an example of a process utilizing the trimmable capacitor of the present invention, the capacitor dielectric is plasma deposited on a suitable electrode, which serves as the substrate, or may be deposited on a suitable substrate. The two-component deposition process is performed as described above to form a capacitor that would have a dielectric constant (and capacitance) somewhat greater than the maximum tolerated value for the application. The as-deposited dielectric constant of the dielectric is determined. Controlled photo-oxidation of the dielectric, by, for example, controlled time exposure of the dielectric to suitable radiated electromagnetic energy source of constant or varying energy density, in the presence of oxygen, will reduce (trim) the dielectric constant (and capacitance) to the desired value. Radiation can be applied: (1) to the entire capacitor dielectric, for example, with a flood exposure tool; (2) selected locals of the capacitor dielectric, for example, with a photolithographic tool; or (3) selected points of the capacitor dielectric, for example, with an electronic beam or laser device. This method allows fine-tuning or trimming of the dielectric constant of the dielectric, and consequently, the capacitance of the capacitor.

In one embodiment of the capacitor with a plasma deposited dielectric of the present invention, a substrate and first electrode combination (Indium Tin Oxide coated glass) can be used to provide a trimmable capacitor with a substrate and first electrode that are transparent to electromagnetic energy that would be used to photo-oxidize the dielectric. After completing fabrication of the capacitor by depositing a second electrode on the dielectric, the dielectric constant (and capacitance) of the fabricated capacitor can be altered by exposing the dielectric to suitable radiated electromagnetic energy through the substrate and first electrode. Oxygen diffusion through the electrodes and substrate is sufficient to support the photo-oxidation process. This embodiment of the capacitor with a plasma deposited dielectric of the present invention can be used to trim the dielectric (and capacitance) when the capacitor is in use in an active electrical circuit that is not limited to the type of circuit application, and that may include active and/or passive circuit components. For example, the capacitor may be used in circuits with passive components, such as resistors, to form a precision RC timing circuit. A fundamental advantage of the capacitor is that it is photoactively trimmable with light in an active circuit, and the photo-oxidation process does not directly interfere with electric charge transport in the active circuit.

Photo-oxidation as used in this specification is generally understood to be accomplished by the exposure of a material to radiated electromagnetic energy in the presence of oxygen in air. Generally, light energy is used, and more specifically, light in the ultraviolet end of the visible electromagnetic spectrum, typically recognized as from 200 nm to 400 nm is used. It will be understood by those skilled in the art that other forms of radiant energy, above visible light in the electromagnetic spectrum, such as x-rays, or gamma or alpha radiation, may be used. Furthermore, since oxygen in the air is the agent for oxidation, other concentrations of oxygen can be used.

EXAMPLES C

In these examples, various LC and Pi filters are fabricated with at least one of the filter's capacitors formed with a plasma deposited dielectric of the present invention.

MIM capacitors used in these filter examples were produced on 100-mm diameter 1,0,0 silicon wafer substrates, which served as the first electrode. Conditions for two-component plasma depositions of the dielectric were similar to those in Examples B. A 50 scc/min flow of monosilane established a base pressure, and then the gas (ethylene) or liquid (toluene) precursor was flowed at a relative 50% pressure of the monosilane. Input deposition power was 200 Watts at 13.56 MHz.

After the capacitor dielectric was plasma deposited on a silicon wafer substrate by the two-component plasma reaction of the present invention, each wafer was quartered, and each quarter was selectively trimmed by exposure to different dosages of radiated electromagnetic energy in the presence of oxygen. One quarter received no exposure, while the other three quarters were selectively exposed to 900, 1800, and 2700 mj/cm$^2$ of UV light at 254 nm from the Model UVG-54 light source identified above. A shadow mask was used to deposit a second aluminum 2-mm dot electrode on each quarter of the substrated dielectric. Suitable conductors were formed to connect each capacitor to the below-indicated value of axial lead inductor to demonstrate the tuning capability of a filter formed from a filter with a plasma deposited dielectric of the present invention. Capacitances and responses of the fabricated filters were measured and are as indicated below. Dielectric constants were calculated from equation (1).

The results for MIM capacitors with plasma deposited dielectric of the present invention that were fabricated on four separate wafers (Sample ID) are identified in Table 7.

TABLE 7

Data for MIM Capacitors with Plasma Deposited Dielectric

| Sample ID | Sample Quarter | Thickness of Dielectric (µm) | Exposure Dosage (mj/cm$^2$) | Dielectric Constant | Capacitance (pF) |
|---|---|---|---|---|---|
| 502-1 | 1 | .215 | 0.0 | 6.001 | 194.00 |
|  | 2 | .207 | 900.0 | 4.778 | 160.05 |
|  | 3 | 227 | 1,800.0 | 4.101 | 125.29 |
|  | 4 | .217 | 2,700.0 | 3.458 | 110.51 |
| 502-2 | 1 | .222 | 0.0 | 6.018 | 187.88 |
|  | 2 | .219 | 900.0 | 4.754 | 151.64 |
|  | 3 | .207 | 1,800.0 | 4.188 | 137.70 |
|  | 4 | .211 | 2,700.0 | 3.444 | 113.91 |
| 502-3 | 1 | .654 | 0.0 | 5.998 | 63.70 |
|  | 2 | .6330 | 900.0 | 4.734 | 51.98 |
|  | 3 | .6327 | 1,800.0 | 4.165 | 45.75 |
|  | 4 | 6690 | 2,700.0 | 3.411 | 35.44 |
| 502-4 | 1 | .667 | 0.0 | 6.007 | 62.60 |
|  | 2 | .655 | 900.0 | 4.528 | 48.05 |
|  | 3 | .679 | 1,800.0 | 4.178 | 42.77 |
|  | 4 | .669 | 2,700.0 | 3.423 | 35.56 |

For Sample ID 502-1, a 1-mm diameter dot electrode MIM capacitor in each quarter-wafer was used to fabricate a low pass, second order Butterworth LC filter (FIG. 6(a)) with a 0.56 µH inductor. Measured filter response characteristics are listed in Table 8.

TABLE 8

Filter Response for Sample ID 502-1 LC Filters with 0.56 µH Inductor

| Exposure Dosage (mj/cm$^2$) | −3.0 dB (MHz) | −6.0 dB (MHz) | −10.0 dB (MHz) |
|---|---|---|---|
| 0.0 | 21.64 | 28.52 | 37.57 |
| 900.0 | 23.51 | 30.98 | 40.81 |
| 1,800.0 | 25.54 | 34.59 | 46.20 |
| 2,700.0 | 26.62 | 36.05 | 48.82 |

For Sample ID 502-2, a 1-mm diameter dot electrode MIM capacitor in each quarter-wafer was used to fabricate a low pass, second order Butterworth LC filter with a 0.12 µH inductor. Measured filter response characteristics are listed in Table 9.

TABLE 9

Filter Response for Sample ID 502-2 LC Filters with 0.12 µH Inductor

| Exposure Dosage (mj/cm$^2$) | −3.0 dB (MHz) | −6.0 dB (MHz) | −10.0 dB (MHz) |
|---|---|---|---|
| 0.0 | 36.55 | 53.03 | 74.86 |
| 900.0 | 44.33 | 62.58 | 85.93 |
| 1,800.0 | 46.84 | 66.12 | 90.80 |
| 2,700.0 | 55.27 | 75.90 | 102.80 |

For Sample ID 502-3, a 1-mm diameter dot electrode MIM capacitor in each quarter-wafer was used to fabricate a low pass, second order Butterworth LC filter with a 0.56 µH inductor. Measured filter response characteristics are listed in Table 10.

TABLE 10

Filter Response for Sample ID 502-3 LC Filters with 0.56 µH Inductor

| Exposure Dosage (mj/cm$^2$) | −3.0 dB (MHz) | −6.0 Db (MHz) | −10.0 dB (MHz) |
|---|---|---|---|
| 0.0 | 30.13 | 43.72 | 60.87 |
| 900.0 | 30.98 | 45.57 | 65.22 |
| 1,800.0 | 30.98 | 46.84 | 67.97 |
| 2,700.0 | 30.98 | 48.82 | 72.82 |

For Sample ID 502-4, a 1-mm diameter dot electrode MIM capacitor in each quarter-wafer was used to fabricate a low pass, second order Butterworth LC filter with a 0.1 µH inductor. Measured filter response characteristics are listed in Table 11.

TABLE 11

Filter Response for Sample ID 502-3 LC Filters with 0.1 µH Inductor

| Exposure Dosage (mj/cm$^2$) | −3.0 dB (MHz) | −6.0 dB (MHz) | −10.0 dB (MHz) |
|---|---|---|---|
| 0.0 | 87.12 | 116.40 | 155.50 |
| 900.0 | 102.80 | 135.40 | 178.40 |
| 1,800.0 | 108.60 | 143.10 | 188.60 |
| 2,700.0 | 119.60 | 157.60 | 207.70 |

For Sample ID 502-1 and Sample ID 502-2, a 1-mm diameter dot electrode MIM capacitor in each quarter-wafer was used to fabricate a low pass, third order Butterworth Pi filter (FIG. 6(b)) with a 1.0 µH inductor. Each Pi filter was fabricated with one capacitor of Sample ID 502-1 and one capacitor of Sample ID 502-2 that both had the same (or no) exposure to UV light. Measured filter response characteristics are listed in Table 12.

TABLE 12

Filter Response for Sample ID 502-1 and Sample ID 502-2 Pi Filters with 1.0 µH Inductor

| Exposure Dosage (mj/cm$^2$) | −3.0 dB (MHz) | −6.0 dB (MHz) | −10.0 dB (MHz) |
|---|---|---|---|
| 0.0 | 16.20 | 19.65 | 23.51 |
| 900.0 | 17.12 | 21.35 | 26.25 |
| 1,800.0 | 17.84 | 22.56 | 28.13 |
| 2,700.0 | 18.34 | 23.84 | 30.55 |

For Sample ID 502-3 and Sample ID 502-4, a 1-mm diameter dot electrode MIM capacitor in each quarter-wafer was used to fabricate a low pass, third order Butterworth Pi filter (FIG. 6(b)) with a 0.1 µH inductor. Each Pi filter was fabricated with one capacitor of Sample ID 502-3 and one capacitor of Sample ID 502-4 that both had the same (or no) exposure to UV light. Measured filter response characteristics are listed in Table 13.

TABLE 13

Filter Response for Sample ID 502-3 and Sample ID 502-4 Pi Filters with 0.1 µH Inductor

| Exposure Dosage (mj/cm$^2$) | −3.0 dB (MHz) | −6.0 dB (MHz) | −10.0 dB (MHz) |
|---|---|---|---|
| 0.0 | 98.63 | 110.10 | 124.70 |
| 900.0 | 110.10 | 123.00 | 141.20 |
| 1,800.0 | 111.70 | 124.70 | 145.10 |
| 2,700.0 | 128.20 | 147.10 | 171.20 |

The data in Table 8 through Table 13 indicate that by varying the exposure dosage of the MIM capacitor dielectric to UV light in the presence of oxygen from zero (that is, a non-photo-oxidized, as-deposited dielectric) to 2,700 mj/cm, the response of the fabricated filters could be adjusted or tuned to fabricate a precisely tuned filter.

Figure 7:
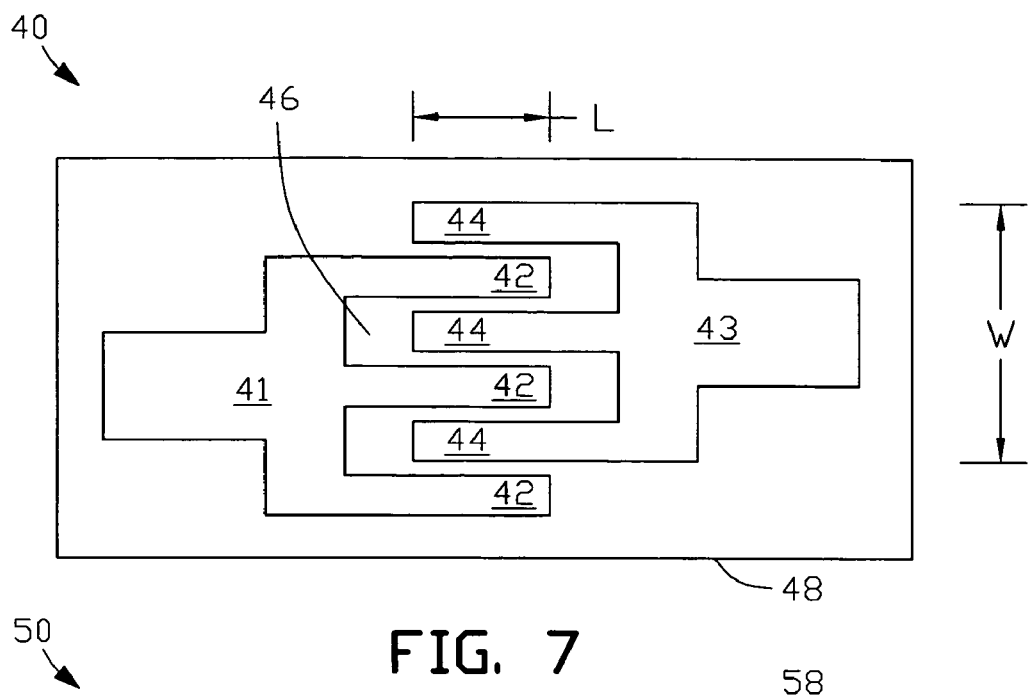
FIG. 7 illustrates the general layout of a planar interdigitated capacitor.

An alternative configuration to the MIM capacitor described above, is a planar interdigitated capacitor (IDC) that uses coupled electrode "fingers" to form a horizontally oriented capacitor, as opposed to a vertically oriented MIM capacitor. The dielectric is deposited between and over the interdigitated fingers of the IDC. FIG. 7 illustrates the planar layout of a typical IDC 40. Fingers 42 of first electrode 41 overlap fingers 44 of second electrode 43. The electrodes can be deposited on substrate 48 by photolithography or any other suitable process. Dielectric 46 is deposited between and over electrodes 41 and 43, and an IDC is formed with distributed capacitance between the interdigitated fingers of the two electrodes. Suitable connections are made to the electrodes for connection to other circuit elements.

Capacitance of an IDC can be calculated from the following closed form equation [from Alley, G. D., *Interdigital Capacitors and their Application to Lumped Element Microwave Circuit: IEEE Trans. Microwave Theory Tech.*, Vol. MTT-18, No. 12, pp. 1028-1033, December 1970]:

$$C = (\epsilon_R + 1)/W \times L[(N-3)A_1 + A_2] \text{ pF/unit length}$$

where: N=total number of fingers for both electrodes;
W=capacitor width as indicated in FIG. 7;
L=capacitor length, or finger overlap, as indicated in FIG. 7;
$A_1$=capacitance contribution of interior fingers;

$A_2$ = capacitance contribution of exterior fingers; and
$\epsilon_R$ = the dielectric constant of the capacitor dielectric.

$A_1$ and $A_2$ can be graphically determined [FIG. 5, Esfandiari, R., Maki, D., and Siracusa, M., *Design of Interdigitated Capacitors and their Application to Gallium Arsenide Monolithic Filters: IEEE Transactions of Microwave Theory and Techniques*, Vol. 31, No. 1, January 1983] with knowledge of the thickness, T, of IDC substrate 48 and finger spacing, X, as illustrated in FIG. 8. Typical finger widths are around 2 mil, and typical finger spacing is around 1 mil.

For the present invention, each IDC was formed on a two-inch diameter glass substrate with four micrometers of sputtered pure aluminum for electrode material. Positive photoresist was applied and used to generate the appropriate etch mask, which was then transfer etched into the underlying aluminum film using a liquid aluminum etch (Arch Chemicals, Aluminum Etch No. 1960, 25:1:5:2—Phosphoric Acid: Nitric Acid:Acetic Acid:Water). After depositing the finger electrodes on the substrate, the capacitor dielectric was deposited between and over the finger electrodes by a two-component plasma deposition similar to those in Examples B. A 50 scc/min flow of monosilane established a base pressure, and then the gas (ethylene) or liquid (toluene) precursor was flowed at a relative 50% pressure of the monosilane. Input deposition power was 200 Watts at 13.56 MHz. Bonding pads for the electrodes were masked to open connections to the electrodes of the IDC. Otherwise, the IDC was entirely coated over with the dielectric. Consequently filter response was measured and capacitance was calculated used the closed form equation set forth above.

Figure 9:
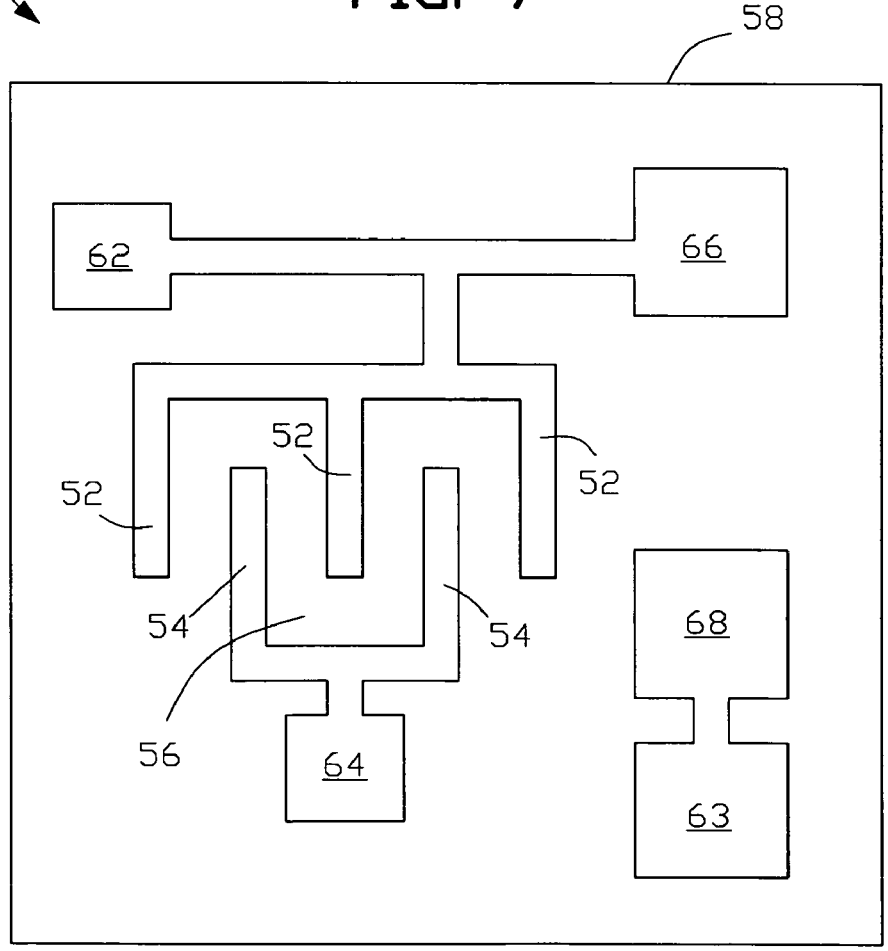
FIG. 9 illustrates the layout of a planar interdigitated capacitor of the present invention for use as an electrical filter of the present invention.

A general layout of the interdigitated filter chip 50, on substrate 58, without the microchip inductor attached is shown in FIG. 9. Ground pad 64 provides a connection point for first finger electrodes 54. First inductor bond pad 66 and second inductor pad 68 provide connections to the chip inductor. Filter input pad 62 and first inductor bond pad 66 are connected to second finger electrodes 52. The two-component plasma deposited dielectric 56 is deposited between and over the finger electrodes on the chip IDC. Second inductor bond pad 68 is connected to filter output pad 63 to form the filter circuit shown in FIG. 10.

Four interdigitated capacitors were fabricated to each form a low pass, second order Butterworth LC filters with a 30 ηH inductor. The dielectric constant of the dielectric for three of the four capacitors were trimmed after fabrication by exposing the dielectric to suitable electromagnetic radiation in the presence of oxygen in a process similar to that described above for the UV light exposure of the MEM capacitors. Exposure dosages and filter response characteristics are listed in Table 14.

TABLE 14

Filter Response for Filters using IDC and 30 ηH Inductor

| Capacitor ID | Exposure Dosage (mj/cm$^2$) | −3.0 dB (MHz) | −6.0 dB (MHz) | −10.0 dB (MHz) |
|---|---|---|---|---|
| 1 | 0.0 | 423.40 | 557.80 | 735.00 |
| 2 | 900.0 | 462.00 | 611.50 | 809.40 |
| 3 | 1,800.0 | 488.20 | 646.20 | 859.30 |
| 4 | 2,700.0 | 513.50 | 686.00 | 912.20 |

Four interdigitated capacitors were fabricated to each form a low pass, second order Butterworth LC filters with a 12 ηH inductor. The dielectric constant of the dielectric for three of the four capacitors were trimmed after fabrication by exposing the dielectric to suitable electromagnetic radiation in the presence of oxygen in a process similar to that described above for the UV light exposure of the MEM capacitors. Exposure dosages and filter response characteristics are listed in Table 15.

TABLE 15

Filter Response for Filters using IDC and 12 ηH Inductor

| Capacitor ID | Exposure Dosage (mj/cm$^2$) | −3.0 dB (MHz) | −6.0 dB (MHz) | −10.0 dB (MHz) |
|---|---|---|---|---|
| 1 | 0.0 | 586.80 | 798.40 | * |
| 2 | 900.0 | 667.30 | 899.70 | * |
| 3 | 1,800.0 | 724.90 | 963.90 | * |
| 4 | 2,700.0 | 783.80 | * | * |

*Data over 1,000 MHz not recorded.

Eight interdigitated capacitors were fabricated to form four pairs of capacitors, with each pair (Capacitor Pair ID in Table 16) used to form a low pass, third order Butterworth Pi filters (FIG. 6(*b*)) with a 39 ηH inductor. The dielectric constant of the dielectric for three of the four pairs of capacitors were trimmed after fabrication by exposing the dielectric to suitable electromagnetic radiation in the presence of oxygen in a process similar to that described above for the UV light exposure of the MEM capacitors. Exposure dosages and filter response characteristics are listed in Table 16.

TABLE 16

Filter Response for Filters using IDC and 39 ηH Inductor

| Capacitor Pair ID | Exposure Dosage (mj/cm$^2$) | −3.0 dB (MHz) | −6.0 dB (MHz) | −10.0 dB (MHz) |
|---|---|---|---|---|
| 1 | 0.0 | 367.20 | 429.30 | 508.80 |
| 2 | 900.0 | 393.40 | 470.60 | 560.40 |
| 3 | 1,800.0 | 411.90 | 495.00 | 597.70 |
| 4 | 2,700.0 | 429.30 | 525.50 | 640.30 |

Eight interdigitated capacitors were fabricated to form four pairs of capacitors, with each pair (Capacitor Pair ID in Table 17) used to form a low pass, third order Butterworth Pi filters with a 10 ηH inductor. The dielectric constant of the dielectric for three of the four pairs of capacitors were trimmed after fabrication by exposing the dielectric to suitable electromagnetic radiation in the presence of oxygen in a process similar to that described above for the UV light exposure of the MEM capacitors. Exposure dosages and filter response characteristics are listed in Table 17.

TABLE 17

Filter Response for Filters using IDC and 10 ηH Inductor

| Capacitor ID | Exposure Dosage (mj/cm$^2$) | −3.0 dB (MHz) | −6.0 dB (MHz) | −10.0 dB (MHz) |
|---|---|---|---|---|
| 1 | 0.0 | 766.00 | 839.80 | 937.70 |
| 2 | 900.0 | 843.60 | 929.10 | * |
| 3 | 1,800.0 | 899.70 | 990.90 | * |
| 4 | 2,700.0 | 959.50 | * | * |

*Data over 1,000 MHz not recorded.

The data in Table 14 through Table 17 indicate that by varying the exposure dosage of an IDC capacitor dielectric to UV light in the presence of oxygen from zero (that is, a non-photo-oxidized, as-deposited dielectric) to 2,700 mj/cm, the response of the fabricated filters could be adjusted or tuned to fabricate a precisely tuned filter.

The application of the capacitor with plasma deposited dielectric of the present invention is not limited to the specific filter types illustrated in the examples. Further with appropriate modifications known to one skilled in the art, the capacitor of the present invention may be applied to vertically oriented interdigitated overlay capacitors wherein the overlapping of finger electrodes occur in vertical layers.

For the above filters, either axial lead inductors or chip inductors were used. In other embodiments of the invention, filters incorporating on-chip spiral inductors can be used. Use of on-chip spiral inductors will significantly reduce the volume of the overall filter design.

The foregoing examples do not limit the scope of the disclosed invention. The scope of the disclosed invention is further set forth in the appended claims.

The invention claimed is:

1. A method of fabricating a capacitor dielectric comprising the steps of:
    fixing a substrate in a plasma chamber;
    substantially evacuating the air from the plasma chamber;
    flowing a non-carbon containing and non-oxygenated silicon donor, and a non-silicon containing and non-oxygenated organic precursor into the plasma chamber; and
    generating a plasma reaction in the plasma chamber to deposit a material comprising (Si—H) and (Si—Si) fragments interstitially situated in an organic polymer matrix on the substrate to form the capacitor dielectric.

2. The method of claim 1 further comprising the step of exposing the capacitor dielectric on the substrate to radiated electromagnetic energy in the presence of oxygen to oxidize silicon in the (Si—H) and (Si—Si) fragments to alter the dielectric constant of the capacitor dielectric.

3. The method of claim 1 wherein the non-silicon containing and non-oxygenated organic precursor is selected from the group consisting of alkanes, alkenes, alkynes, phenyls and aromatic hydrocarbons.

4. The method of claim 1 wherein the non-silicon containing and non-oxygenated organic precursor is selected from the group consisting of ethylene, methane, ethane and toluene.

5. The method of claim 1 wherein the non-carbon containing and non-oxygenated silicon donor is selected from the group consisting of monosilane, disilane and dichlorosilane.

6. The method of claim 5 wherein the non-silicon containing and non-oxygenated organic precursor is selected from the group consisting of ethylene, methane, ethane and toluene.

7. A method of fabricating a capacitor comprising the steps of:
    forming a first electrical conductor;
    fixing the first electrical conductor in a plasma chamber;
    substantially evacuating the air from the plasma chamber;
    flowing a non-carbon containing and non-oxygenated silicon donor, and a non-silicon containing and non-oxygenated organic precursor into the plasma chamber;
    generating a plasma reaction in the plasma chamber to deposit a material comprising (Si—H) and (Si—Si) fragments interstitially situated in an organic polymer matrix on the first electrical conductor; and
    forming a second electrical conductor at least partially on the material.

8. The method of claim 7 wherein the non-silicon containing and non-oxygenated organic precursor is selected from the group consisting of alkanes, alkenes, alkynes, phenyls and aromatic hydrocarbons.

9. The method of claim 7 wherein the non-silicon containing and non-oxygenated organic precursor is selected from the group consisting of ethylene, methane, ethane and toluene.

10. The method of claim 7 wherein the non-carbon containing and non-oxygenated silicon donor is selected from the group consisting of monosilane, disilane and dichlorosilane.

11. The method of claim 10 wherein the non-silicon containing and non-oxygenated organic precursor is selected from the group consisting of ethylene, methane, ethane and toluene.

12. The method of claim 7 further comprising the step of exposing the material to radiated electromagnetic energy in the presence of oxygen to oxidize silicon in the (Si—H) and (Si—Si) fragments to alter the dielectric constant of the material.

13. The method of claim 7 further comprising the steps of inserting the capacitor in an electrically active circuit, and exposing the material to radiated electromagnetic energy in the presence of oxygen to oxidize silicon in the (Si—H) and (Si—Si) fragments to alter the dielectric constant of the material.

14. A method of forming an electrical filter comprising the steps of:
    fabricating at least one capacitor by forming a first electrical conductor; fixing the first electrical conductor in a plasma chamber; substantially evacuating the air from the plasma chamber; flowing a non-carbon containing and non-oxygenated silicon donor, and a non-silicon containing and non-oxygenated organic precursor into the plasma chamber; generating a plasma reaction in the plasma chamber to deposit a material comprising (Si—H) and (Si—Si) fragments interstitially situated in an organic polymer matrix on the first electrical conductor; and forming a second electrical conductor at least partially on the material;
    fabricating at least one inductor; and
    connecting the at least one inductor to the at least one capacitor to form the electrical filter.

15. The method of claim 14 wherein the non-silicon containing and non-oxygenated organic precursor is selected from the group consisting of alkanes, alkenes, alkynes, phenyls and aromatic hydrocarbons.

16. The method of claim 14 wherein the non-silicon containing and non-oxygenated organic precursor is selected from the group consisting of ethylene, methane, ethane and toluene.

17. The method of claim 14 wherein the non-carbon containing and non-oxygenated silicon donor is selected from the group consisting of monosilane, disilane and dichlorosilane.

18. The method of claim 17 wherein the non-silicon containing and non-oxygenated organic precursor is selected from the group consisting of ethylene, methane, ethane and toluene.

19. The method of claim 14 further comprising the step of exposing the material to radiated electromagnetic energy in the presence of oxygen to oxidize silicon in the (Si—H) and (Si—Si) fragments to alter the response characteristics of the electrical filter.

20. The method of claim 14 further comprising the steps of inserting the electrical filter in an electrically active circuit, and exposing the material to radiated electromagnetic energy in the presence of oxygen to oxidize silicon in the (Si—H) and (Si—Si) fragments to alter the response characteristics of the electrical filter.

* * * * *